(12) United States Patent
Raynor

(10) Patent No.: US 10,418,402 B2
(45) Date of Patent: Sep. 17, 2019

(54) NEAR ULTRAVIOLET PHOTOCELL

(71) Applicant: STMicroelectronics (Research & Development) Limited, Marlow (GB)

(72) Inventor: Jeffrey M. Raynor, Edinburgh (GB)

(73) Assignee: STMicroelectronics (Research & Development) Limited, Marlow, Bucks (GB)

( * ) Notice: Subject to any disclaimer, the term of this patent is extended or adjusted under 35 U.S.C. 154(b) by 0 days.

(21) Appl. No.: 15/827,554

(22) Filed: Nov. 30, 2017

(65) Prior Publication Data
US 2019/0165010 A1 May 30, 2019

(51) Int. Cl.
*H01L 27/144* (2006.01)
*H01L 31/0352* (2006.01)
*H01L 27/146* (2006.01)
*H01L 31/105* (2006.01)
*H01L 31/103* (2006.01)
*H01L 31/101* (2006.01)
*H04N 5/374* (2011.01)
*H04N 5/378* (2011.01)

(52) U.S. Cl.
CPC .... *H01L 27/1463* (2013.01); *H01L 27/14625* (2013.01); *H01L 31/103* (2013.01); *H01L 31/105* (2013.01); *H01L 31/1013* (2013.01); *H04N 5/374* (2013.01); *H04N 5/378* (2013.01)

(58) Field of Classification Search
CPC ........... H01L 31/1013; H01L 27/14643; H01L 27/1463; H01L 31/103; H01L 27/1443; H01L 31/1185; H01L 33/405; H01L 31/02162; H01L 33/60; H01L 31/105; H01L 27/14624; H04N 5/374; H04N 5/378
USPC ..................................... 250/370.08
See application file for complete search history.

(56) References Cited

U.S. PATENT DOCUMENTS

| | | | | |
|---|---|---|---|---|
| 4,127,932 A * | 12/1978 | Hartman | ............ | H01L 31/105 257/438 |
| 5,726,440 A * | 3/1998 | Kalkhoran | ............ | H01L 31/103 250/214.1 |
| 6,259,085 B1 * | 7/2001 | Holland | ............ | H01L 27/14601 250/208.1 |
| 6,998,659 B2 | 2/2006 | Raynor | | |
| 9,202,840 B2 * | 12/2015 | Gidon | ............... | H01L 27/14627 |
| 9,818,794 B2 * | 11/2017 | Okita | ................. | H01L 27/1461 |
| 2003/0218195 A1 * | 11/2003 | Raynor | ............. | H01L 27/14609 257/292 |
| 2005/0179093 A1 * | 8/2005 | Morris | ................. | H01L 21/761 257/371 |

(Continued)

*Primary Examiner* — Taeho Jo
(74) *Attorney, Agent, or Firm* — Slater Matsil, LLP

(57) ABSTRACT

In an embodiment, an image sensor includes a semiconductor substrate, an epitaxial layer disposed over the semiconductor substrate, a first heavily doped region disposed in the epitaxial layer, and a shallow trench isolation region disposed in the epitaxial layer and surrounding the first heavily doped region. The semiconductor substrate and the epitaxial layer are of a first doping type and the semiconductor substrate is coupled to a reference potential node. The first heavily doped region is of a second doping type opposite to the first doping type. The epitaxial layer, the first heavily doped region, and the shallow trench isolation region are part of a p-n junction photodiode configured to operate in the near ultraviolet region.

35 Claims, 13 Drawing Sheets

(56) References Cited

U.S. PATENT DOCUMENTS

| | | | |
|---|---|---|---|
| 2005/0258496 A1* | 11/2005 | Tsuchiko | H01L 27/0629 257/378 |
| 2006/0081768 A1* | 4/2006 | Dutta | H01L 27/14634 250/214.1 |
| 2006/0131619 A1* | 6/2006 | Wu | H01L 27/0727 257/260 |
| 2007/0290265 A1* | 12/2007 | Augusto | H01L 21/84 257/351 |
| 2008/0078444 A1* | 4/2008 | Atanackovic | H01L 31/06 136/256 |
| 2008/0277753 A1* | 11/2008 | Bui | H01L 27/1446 257/437 |
| 2008/0290382 A1* | 11/2008 | Hirota | H01L 27/14627 257/291 |
| 2009/0140366 A1* | 6/2009 | Bui | H01L 27/1446 257/461 |
| 2009/0212301 A1* | 8/2009 | Zhang | H01L 29/0619 257/77 |
| 2011/0175185 A1* | 7/2011 | Asher | H01L 27/14621 257/432 |
| 2011/0248369 A1* | 10/2011 | Bui | G01T 1/2018 257/435 |
| 2011/0291103 A1* | 12/2011 | Mazzillo | H01L 31/03529 257/76 |
| 2012/0132954 A1* | 5/2012 | Kouno | H01L 29/0619 257/140 |
| 2012/0175686 A1* | 7/2012 | Hirota | H01L 27/14627 257/225 |
| 2013/0115739 A1* | 5/2013 | Akiyama | H01L 21/20 438/137 |
| 2014/0054641 A1* | 2/2014 | Akiyama | H01L 21/20 257/121 |
| 2014/0252524 A1* | 9/2014 | Sanfilippo | H01L 27/14643 257/432 |
| 2014/0353792 A1* | 12/2014 | Ju | H01L 31/00 257/446 |
| 2015/0014804 A1* | 1/2015 | Bui | H01L 27/1446 257/432 |
| 2015/0171256 A1* | 6/2015 | Bui | H01L 27/1463 257/428 |
| 2015/0325737 A1* | 11/2015 | Mazzillo | H01L 31/107 438/73 |
| 2016/0284919 A1* | 9/2016 | Sampath | H01L 31/1075 |
| 2016/0343881 A1* | 11/2016 | Pang | H01L 21/76 |
| 2017/0098730 A1* | 4/2017 | Mazzillo | H01L 31/022416 |
| 2017/0150078 A1* | 5/2017 | Ukai | H01L 27/14636 |
| 2017/0207360 A1* | 7/2017 | Mazzillo | H01L 31/1013 |
| 2017/0314989 A1* | 11/2017 | Mazzillo | G01J 1/429 |
| 2018/0295295 A1* | 10/2018 | Hicks | H01L 27/14689 |

* cited by examiner

NEAR ULTRAVIOLET PHOTOCELL

TECHNICAL FIELD

The present invention relates generally to photonics, and, in particular embodiments, to a near ultraviolet photocell.

BACKGROUND

The depth of absorption of a photon in, for example silicon, is dependent on the wavelength of the photon. The shorter the wavelength, the greater the energy level, the more likely the photon is absorbed by silicon. As an example, a near ultraviolet (NUV) photon is typically absorbed within about the first 1 µm of silicon. Red and green photons with lower energy levels than NUV photons are more likely to be absorbed at a deeper depth, such as within about 2 µm and 3 µm of silicon.

A photodiode is a semiconductor device that typically has a p-type semiconductor region and an n-type semiconductor region. The boundary between the p-region and n-region forms the p-n junction of the photodiode. During operation, the photodiode is in reverse bias mode. When the reverse biased photodiode is exposed to photons, electron-hole pairs are generated around the p-n junction of the photodiode. The electron-hole pairs formed around the p-n junction are swept away to the respective anode and cathode of the photodiode and a photocurrent can be measured.

Due to the capacitance of the photodiode, the voltage signal generated at the photodiode, is inversely related to the capacitance of the p-n junction and directly related to the photocurrent. The capacitance of the junction is inversely related to the width of the depletion region in the p-n junction because mobile charges at the edges of the depletion region respond to an applied voltage. The width of the depletion region is dependent on the doping concentration of the p and n-regions as well as the applied voltage.

The collection efficiency of a photodiode is a measurement of the number of generated electron hole pairs to the number of incident photons and also the number of charge carriers collected at the measuring node with respect to the number of generated electron hole pairs. The quantum efficiency of a photodiode is a measurement of the collected electron hole pairs with respect to the number of incident photons.

In a silicon photodiode, designed for visible light, the light absorbing portion of the photodiode has a depth of about 2 µm and 3 µm. In such a structure, if light is absorbed in a shallow surface region (i.e., NUV), charge carriers that are generated from the absorbed light are more likely to re-combine before reaching the photo-collection region of the photodiode, therefore reducing its collection efficiency.

SUMMARY

Technical advantages are generally achieved by embodiments of this disclosure which describe systems and methods of a near ultraviolet photocell.

In accordance with an embodiment, an image sensor includes a semiconductor substrate, an epitaxial layer disposed over the semiconductor substrate, a first heavily doped region disposed in the epitaxial layer, and a shallow trench isolation region disposed in the epitaxial layer and surrounding the first heavily doped region. The semiconductor substrate and the epitaxial layer are of a first doping type and the semiconductor substrate is coupled to a reference potential node. The first heavily doped region is of a second doping type opposite to the first doping type. The epitaxial layer, the first heavily doped region, and the shallow trench isolation region are part of a p-n junction photodiode configured to operate in the near ultraviolet region.

In accordance with another embodiment, an image sensor includes a semiconductor substrate coupled to a reference potential node, an epitaxial layer disposed over the semiconductor substrate, and a first heavily doped region disposed in the epitaxial layer. The semiconductor substrate and the epitaxial layer are of a first doping type. The first heavily doped region being of a second doping type opposite to the first doping type. The epitaxial layer and the first heavily doped region are part of a p-n junction photodiode configured to operate in the near ultraviolet region.

In accordance with yet another embodiment, a method of operating an image sensor includes providing a photodiode that includes an epitaxial layer disposed over a semiconductor substrate, a first heavily doped region disposed in the epitaxial layer, a shallow trench isolation region disposed in the epitaxial layer and surrounding the first heavily doped region. The epitaxial layer is of a first doping type and the first heavily doped region is of a second doping type opposite to the first doping type. The method further includes applying bias to set the photodiode under reverse bias, exposing the photodiode to a photon having a wavelength in the near ultraviolet range, generating an electron-hole pair in the photodiode, transferring an electron or a hole of the electron-hole pair to a connector node, and converting the charge of the electron or the hole collected at the connector node to a read voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The specific embodiments discussed are merely illustrative of specific ways to make and use the invention, and do not limit the scope of the invention.

A typical image sensor includes an array of pixels that are generally arranged in a matrix style design. Each pixel uses a photocell as a light sensor. In some applications, the photocell may comprise a silicon photodiode. Ambient light sensors (ALSs) generally operate over the visible wavelengths (between about 400 nm and 700 nm) and sometimes operate in the near-infrared wavelengths (between about 700 nm and 1000 nm). It is desirable to extend the operation of an ALS to detect light over a wider range, such as, near ultraviolet (between about 300 nm to 400 nm), for example, to monitor and minimize exposure to undesired radiations.

Embodiments of this disclosure increase the near ultraviolet (NUV) performance of photodiodes by designing diodes having low readout noise, high collection efficiency, and a low capacitance for higher conversion gain.

Figure 10:
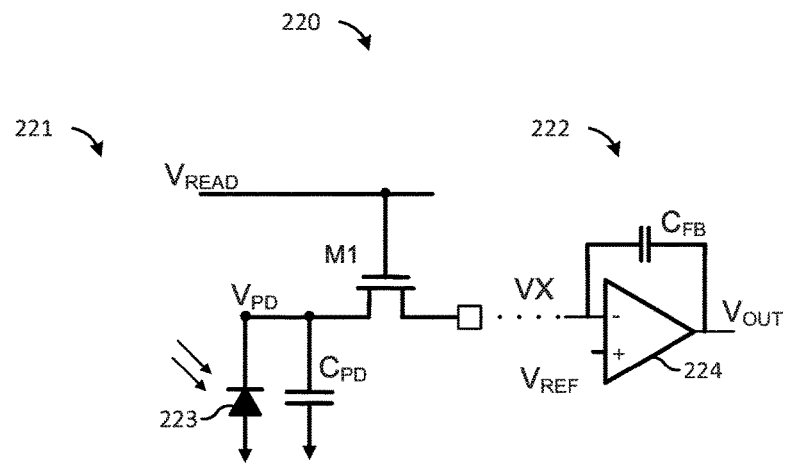
FIG. 10 is a circuit diagram of a conventional 1 transistor (1T) active pixel sensor circuit.
Figure 11:
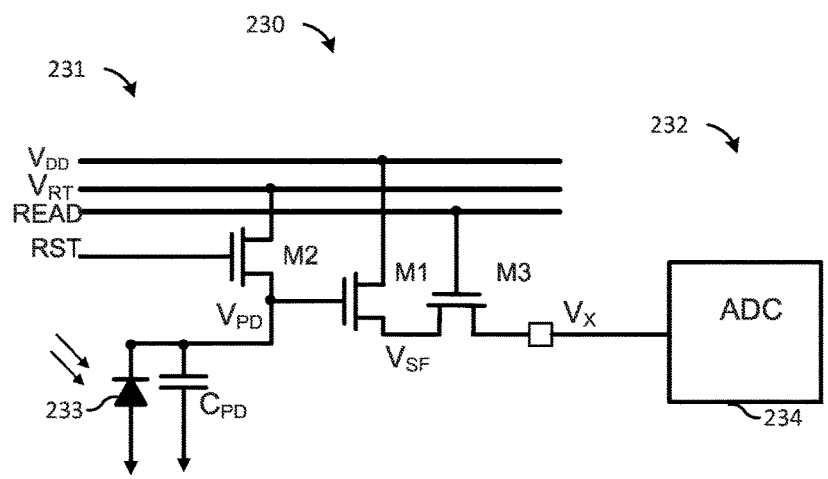
FIG. 11 is a circuit diagram of a conventional 3 transistor (1T) active pixel sensor circuit.
Figure 12:
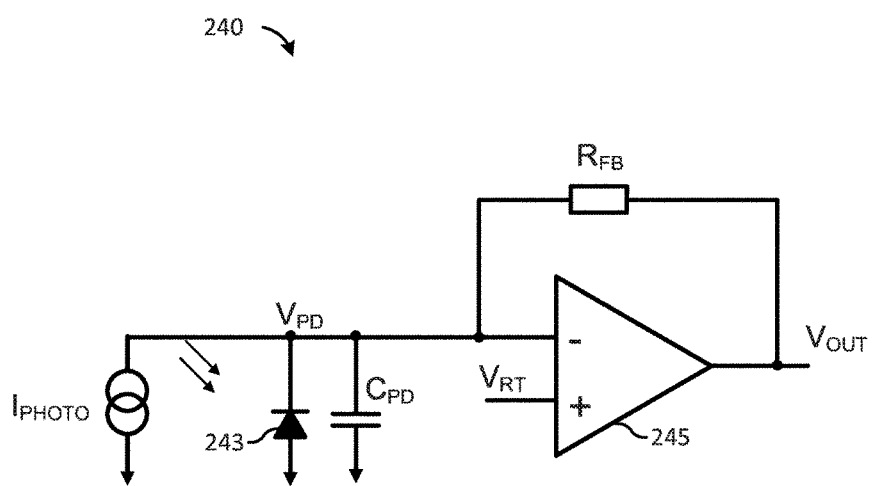
FIG. 12 is a circuit diagram of a conventional transimpedance amplifier sensor circuit.

Cross-sectional views of some conventional photodiodes will be described using FIGS. 1A-B. In FIGS. 2, 5, 6, 7, 13, cross-sectional views of embodiment NUV photocells will be described. Plan views of embodiment NUV photocells will be described using FIGS. 3, 4, and 14. In FIG. 8, a cross-sectional view of a semiconductor device in accordance with an embodiment of the present invention will be described. A flow chart of an embodiment NUV photocell will be described using FIG. 9. In FIG. 10, a conventional 1 transistor (1T) active pixel sensor circuit will be described. A circuit diagram of a conventional 3 transistor (3T) active pixel sensor circuit will be described in FIG. 11. In FIG. 12, a circuit diagram of a conventional transimpedance amplifier sensor circuit will be described. In the following discussion, the same elements are designated with the same reference numbers in the various figures.

Figure 1A:
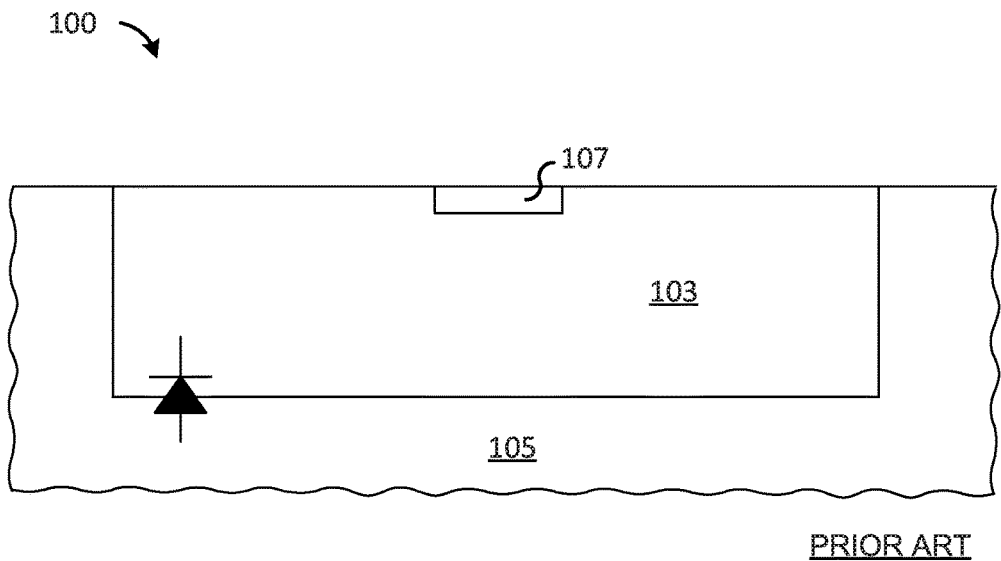
FIG. 1A is a cross-sectional view of a conventional photodiode.

FIG. 1A illustrates a cross-section of a conventional photodiode 100. The photodiode 100 comprises an n-well region 103 surrounded by a p-type region 105. The photodiode 100 also comprises a connector node 107 formed in the n-well region 103 for readout. The n-well region 103 and the p-type region 105 are typically lightly doped silicon. The n-well region 103 may be formed at a depth of about 2 µm and 3 µm.

A depletion region is formed between the n-well region 103 and the p-type region 105. During operation of the photodiode 100, the photons incident on the photodiode 100 create electron hole pairs around this depletion region. The charge generated at the photodiode is subsequently captured at the connector node 107 for readout.

The low doping concentration of the n-well region 103 creates a wide depletion region in the photodiode 100. The wide depletion region has a low junction capacitance, which is beneficial for good collection efficiency. This is because a same change in collected charge results in a larger voltage at a smaller capacitance ($\Delta V = \Delta Q/C$). However, the photodiode 100 is designed for working with light having a wavelength in the range of 500-1000 nm. If this photodiode is exposed to NUV, the charges generated at the surface of the photodiode 100 by the NUV photons re-combine and will likely be lost before reaching the connector node 107.

To improve efficiency for NUV operations, shallower junctions are preferred. As the depth of the p-n junction is indirectly related to the material doping concentration, a shallow junction may be formed that creates regions of high dopant concentration (i.e., $10^{18}$ to $10^{20}$ cm$^{-3}$).

Figure 1B:
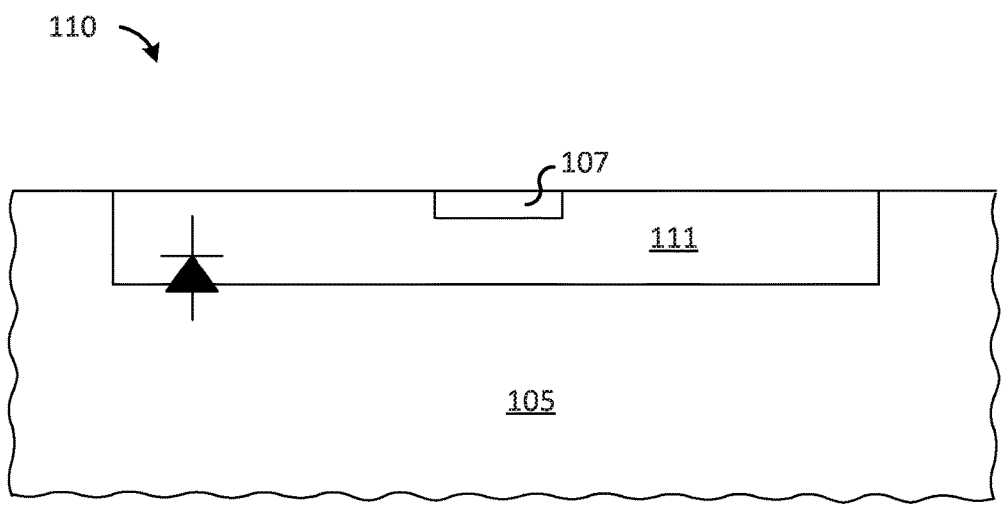
FIG. 1B is a cross-sectional view of another conventional photodiode.

FIG. 1B illustrates a cross-section of another conventional photodiode no with shallow junctions. The photodiode no comprises a heavily doped n-type region 111 surrounded by the p-type region 105. The connector node 107 is formed in the heavily doped n-type region 111 for readout. Heavily doped n-type region 111 may be formed at a depth of about 1 µm over the p-type region 105.

During operation of the photodiode 110, a depletion region is formed, between the p-type region 105 and the heavily doped n-type region 111. Similar to FIG. 1A, the photons incident on the photodiode no create electron hole pairs, which are efficiently collected at the connector node 107 for readout prior to recombination.

The inventors of the application have now identified that although the shallow junction of the photodiode no helps to capture charges in NUV applications, there are some drawbacks in this design. As an example, the high doping concentration of the heavily doped n-type region 111 decreases the width of the depletion region of the photodiode 110. The decrease in the depletion width results in an increase to the junction capacitance and reduced read efficiency. In some instances, the junction capacitance in the photodiode no may be 2-5 times greater than the junction capacitance of a typical p-n photodiode, as in, for example, FIG. 1A.

Another disadvantage of the photodiode no is that to improve collection efficiency, heavily doped n-type region 111 may be extended to cover most of the surface of the photodiode 110. The large surface area further increases capacitance and decreases the charge to voltage conversion. As an example, a photodiode having a 100×100 µm² surface area may have a capacitance near 1.2 pF and a generated voltage of only 133 nV.

One method to reduce junction capacitance is to reduce the junction area. This is because the junction capacitance is directly dependent on the area of the capacitor plates. Other solutions to improve NUV efficiency is to use process modifications such as thinning of the top layers and adding micro-structures; however these are typically costly to implement.

A visible photodiode with a lower junction capacitance is described in U.S. Pat. No. 6,998,659. However, this photodiode is designed for working with light in the range of 500 nm to 1000 nm. NUV will cause charge generation near the surface, which will be lost resulting in poor collection efficiency.

Figure 2:
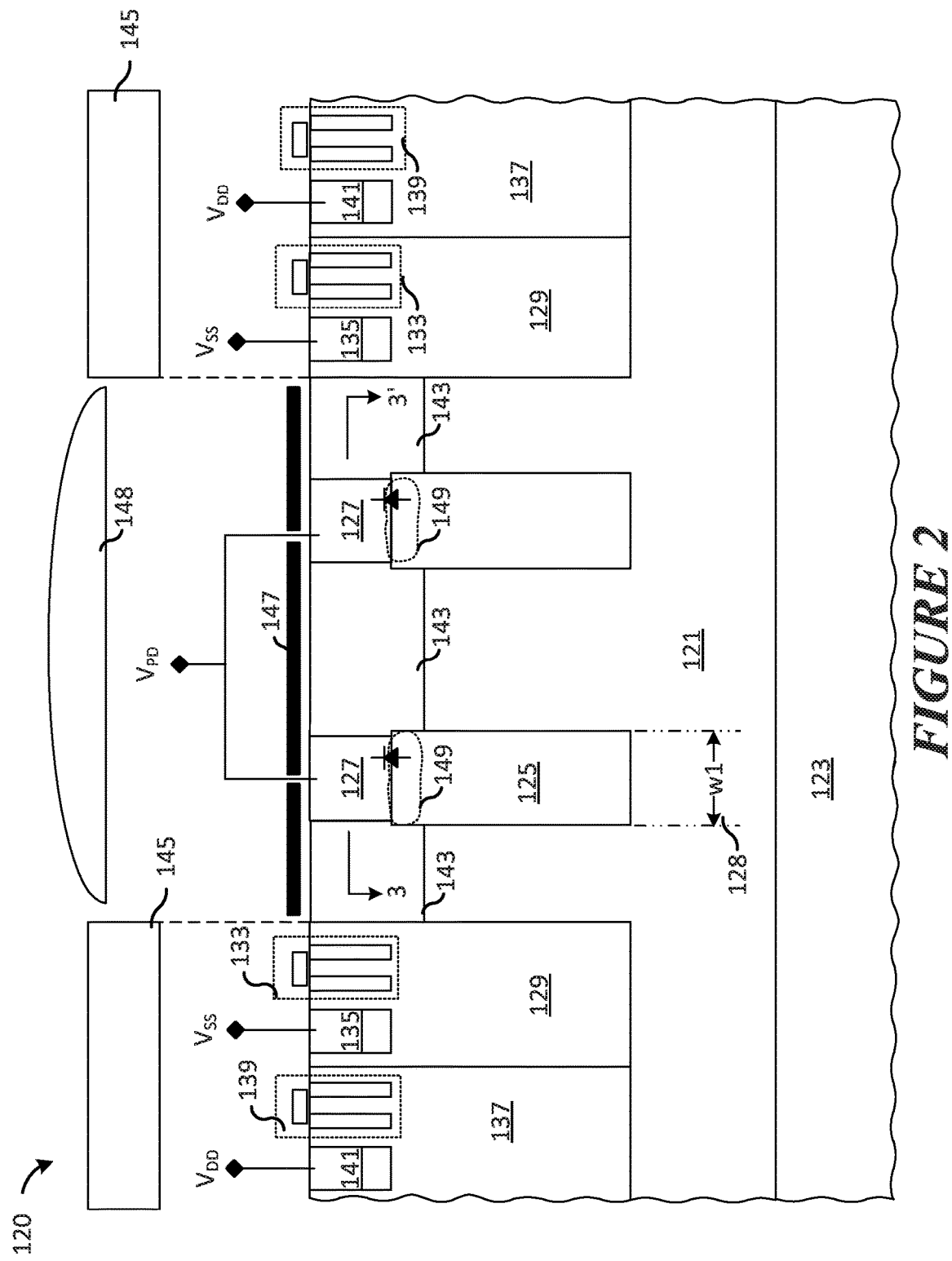
FIG. 2 is a cross-sectional view of an embodiment near ultraviolet (NUV) photocell.

FIG. 2 illustrates a cross-section of an NUV photocell 120. A p-epitaxial layer 121 is formed on a heavily doped P$^{++}$ silicon substrate 123. The heavily doped P$^{++}$ silicon substrate 123 may be (100) monocrystalline silicon in one embodiment. The heavily doped P$^{++}$ silicon substrate 123 may be doped to $10^{17}$ cm$^{-3}$ to $10^{19}$ cm$^{-3}$ in various embodiments. The p-epitaxial layer 121 may be formed using an epitaxial process. In various embodiments, the p-epitaxial layer 121 may be doped with a p-type dopant such as boron to $10^{14}$ cm$^{-3}$ to $10^{17}$ cm$^{-3}$.

While described herein with silicon, it is understood that other semiconductors (e.g., silicon carbon, silicon germanium, and germanium) could also be used in some embodiments. In other embodiments, the p-epitaxial layer 121 and heavily doped P$^{++}$ silicon substrate 123 may be flexible substrates formed over different non-flat surfaces.

P-doped wells 125 are formed within the p-epitaxial layer 121 at a depth of between 1 μm to 2 μm and having a first width 128 (w1) of 1 μm to 15 μm. In various embodiments, the p-doped wells 125 may be doped to $10^{15}$ to $10^{17}$ cm$^{-3}$. In some embodiments, the processes used to form a photodiode such as in NUV photocell 120 are shared with a common CMOS process. Therefore, the depth of the p-doped wells 125 are similar to the p-wells in the CMOS area (if present).

A heavily doped n-type region 127 is formed over each of the p-doped wells 125 at a depth of nearly 0.5 μm. The heavily doped n-type regions 127 may be formed at the same time as the source and drain implants of the common CMOS process. Therefore, the heavily doped n-type regions 127 may have the same depth as the corresponding source drain regions of the NMOS transistors in the CMOS area. In addition, the heavily doped n-type regions 127 may be formed by doping with arsenic, phosphorus, and/or antimony. In various embodiments, the heavily doped n-type regions 127 may be doped to $10^{18}$ cm$^{-3}$ to $10^{21}$ cm$^{-3}$.

A connector node may be formed in each of the heavily doped n-type regions 127 for readout (not shown). For example, a contact via may be formed through the anti-reflection layer 147 so as to contact a silicide region formed under the contact via.

Each of the heavily doped n-type regions 127 and its respective p-doped wells 125 create a p-n photodiode. Thus each NUV photocell 120 includes one or more of p-n photodiodes.

The lateral distance between the heavily doped n-type regions 127 is a trade-off between collection efficiency of the NUV photocell 120 and the junction capacitance of each photodiode. As the distance between adjacent heavily doped n-type regions 127 is reduced, the collection efficiency of the NUV photocell 120 increases and a greater fraction of the charge generated from the photon absorption are collected. However, as the distance between heavily doped n-type regions 127 decreases, the relative area of the depletion region in relation to the size of the NUV photocell 120 increases and therefore the junction capacitance of the NUV photocell 120 increases. The increased junction capacitance results in a lower conversion gain causing a reduction in the charge to voltage conversion rate.

Conversely, increasing the spacing between the heavily doped n-type regions 127 reduces the junction capacitance of each photodiode. Although the junction capacitance is reduced, the photo-charges will have to diffuse over a greater distance to reach the connector node. The increased diffusion distance increases the probability of recombination resulting in a reduced conversion efficiency. The probability of recombination depends heavily on the purity and doping of the corresponding semiconductor material in which charge transport is occurring. Therefore, the number of heavily doped n-type regions 127 is adjusted depending on the size of the photo-cell to maximize collection efficiency and the voltage response. For epitaxial layers such as p-epitaxial layer 121, spacing between adjacent heavily doped n-type regions 127 may be 10 μm to 50 μm, and between 20 μm to 40 μm in one embodiment.

A first guard ring 129 may laterally surround the photodiodes of the NUV photocell 120 and parts of the p-epitaxial layer 121. The first guard ring 129 may be formed such that the inner section of the ring, where the photodiodes are located, has a width of 10 μm to 1000 μm. In various embodiments, the first guard ring 129 has the opposite type of doping type than the heavily doped n-type regions 127. Therefore, in some embodiments, the first guard ring 129 may be formed as a p-doped well having a width of 1 μm to 5 μm. The first guard ring 129 may be formed at a lateral distance of at least 1 μm and up to 25 μm away from neighboring heavily doped n-type regions 127. First body terminals 135 may be formed at the surface of the first guard ring 129 to appropriately bias the first guard ring 129 during the operation of the NUV photocell 120.

In some embodiments, an additional second guard ring 137 may laterally surround the first guard ring 129. In various embodiments, the second guard ring 137 has an opposite doping type than the first guard ring 129. The second guard ring 137 may have a width of 1 μm to 200 μm. Second body terminals 141 may be formed at the surface of the second guard ring 137 to control the biasing of the second guard ring 137 during operation of the NUV photocell 120.

N-type metal oxide semiconductor (NMOS) transistors 133 and p-type metal oxide semiconductor (PMOS) transistors 139 may be formed, respectively, in the first guard ring 129 and the second guard ring 137, and may be used as pails of a readout circuitry of the NUV photocell 120. Although, in some embodiments the NMOS transistors 133 and PMOS transistors 139 may perform circuit operations that are un-related to the readout circuitry. The NMOS transistors 133 and PMOS transistors 139 may be formed using standard CMOS processes that are also shared with the processes used for forming the NUV photocell 120 such as the regions described above.

In some optional embodiments, to improve isolation between the heavily doped n-type regions 127 as well as between the heavily doped n-type regions 127 and the first guard ring 129, shallow trench isolations (STI) region 143 may be formed. The STI region 143 may extend past the junction between the heavily doped n-type regions 127 and the associated p-doped wells 125.

In other optional embodiments, a metal shield 145 is used to block incident light from the photo active area of the NUV photocell 120 as illustrated in FIG. 2.

An anti-reflection layer 147 is optionally formed as a coating layer on the top surface of the NUV photocell 120 over the heavily doped n-type regions 127 and the p-epitaxial layer 121/STI regions 143. The anti-reflection layer 147 increases the amount of light that is captured by the NUV photocell 120 by reflecting light back to the photo-diode, for example, by matching the refractive index at the surface of incidence. The anti-reflection layer 147 may be made from polysilicon or silicon nitride.

The anti-reflection layer 147 may be optimized for NUV wavelengths (i.e., thinner than an anti-reflection layer of a conventional photocell operating in visible light applications). In some embodiments, the anti-reflection layer 147 may be designed to have a thickness with an approximate electrical length corresponding to a quarter wavelength of the NUV. As an example, to increase the amount of light that is captured by a radiation in the NUV region of 300 mm, the anti-reflection layer 147 may be 75 mm thick.

In some embodiments, to concentrate incident photons into the photo active area of the photodiode, a micro-lens 148 may be positioned over the anti-reflection layer 147.

During operation of the NUV photocell 120, first body terminals 135 are biased to a neutral reference potential (e.g., $V_{SS}$=0V) and second body terminals 141 are biased positive to supply voltage ($V_{DD}$), which is typically more positive than the potential applied across the photodiode. Light photons, incident on the NUV photocell 120, generate electron hole pairs in the body of each of the photodiodes. These charge carriers randomly diffuse in the body of the photodiode until they reach the depletion region 149 for collection. Subsequently, the charge carriers are converted to a voltage and read at the connector node 107 ($V_{PD}$) of the NUV photocell 120.

In the NUV photocell 120, in comparison to a heavily doped region covering substantially the entire top surface such as FIG. 1B, the junction capacitance is about one tenth the junction capacitance of the device in FIG. 1B. As an example, the NUV photocell 120 with a dimension of 100×100 µm², may have a capacitance of around 12 pF and a generated voltage of about 1.3 µV, which is an improvement of nearly ten times greater than that in FIG. 1B.

Figure 3:
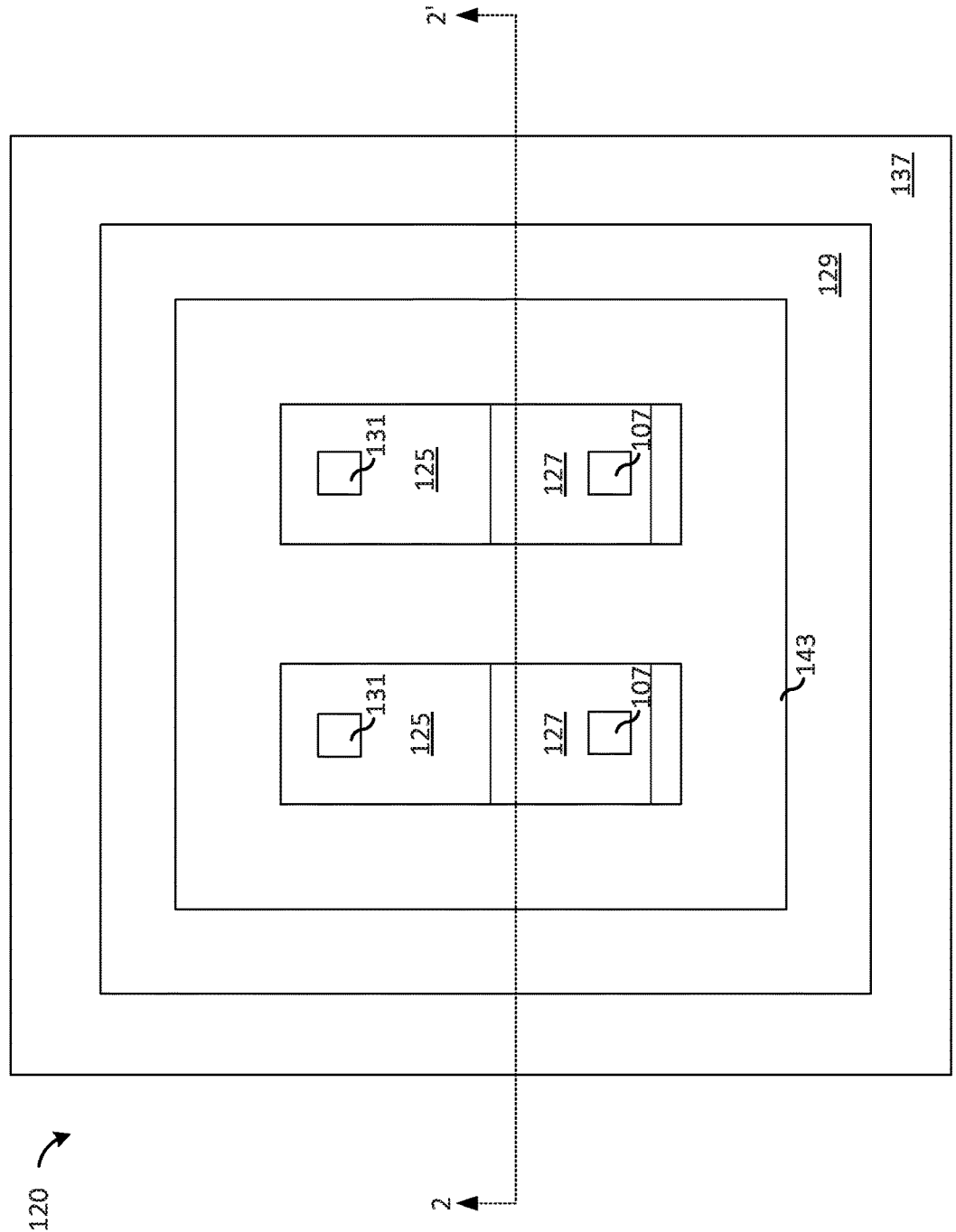
FIG. 3 is a plan view of an embodiment NUV photocell.
Figure 4:
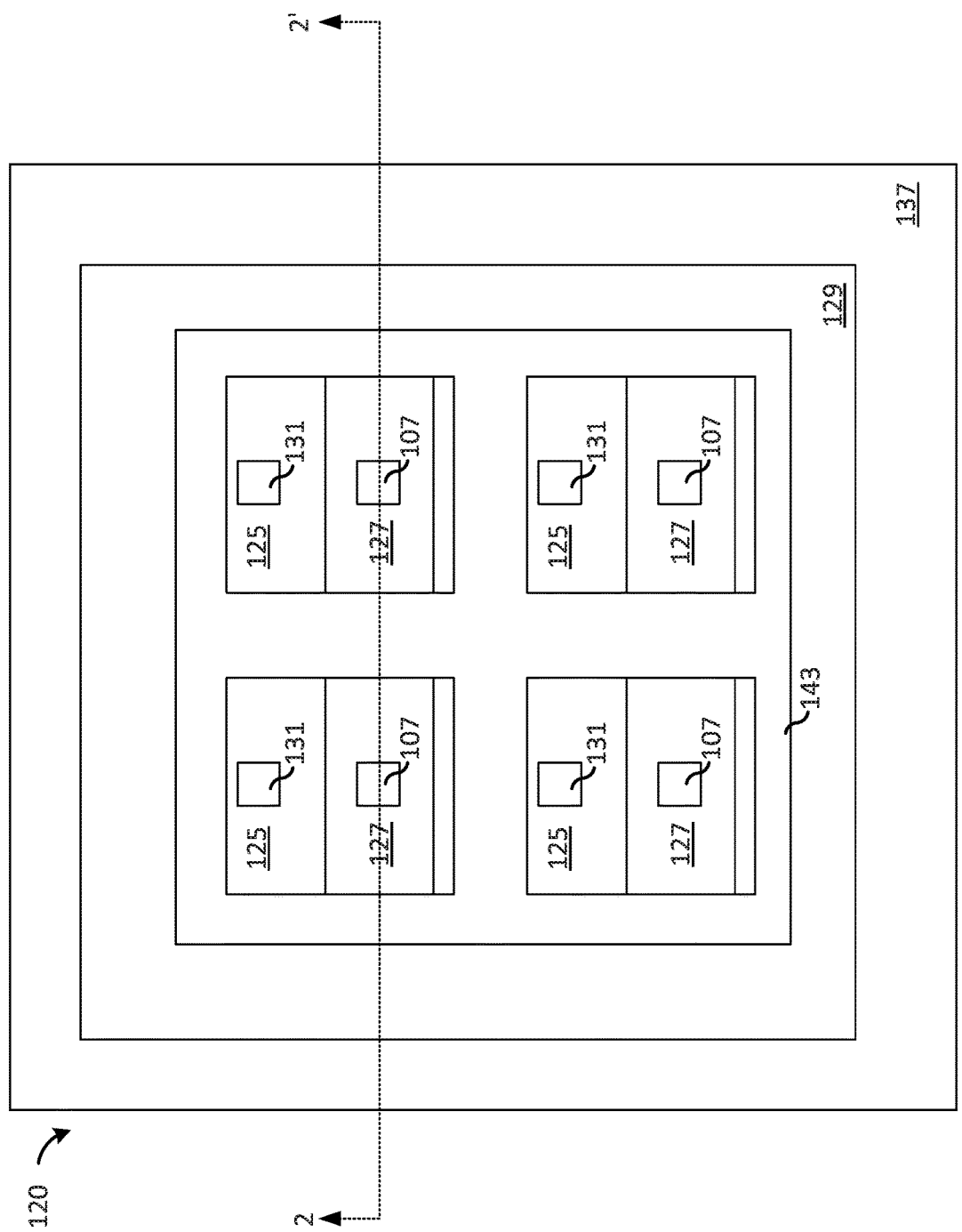
FIG. 4 is another plan view of an embodiment NUV photocell.

FIGS. 3 and 4 illustrate alternate example top sectional views of the NUV photocell 120 previously described in FIG. 2. The line 3-3' in FIG. 2 illustrates a representative sectional view in FIG. 2 that is illustrated by FIGS. 3-4. The line 2-2' of FIGS. 3-4 illustrates an example location of a cross sectional cut with respect to FIG. 2 of the NUV photocell 120.

To simplify the description of FIGS. 3-4, the PMOS transistors 139, the NMOS transistors 133, the anti-reflection layer 147, the first body terminals 135, the second body terminals 141, and the metal shield 145 are not shown. In some embodiments, to properly bias the p-doped wells 125, contact terminals may be exposed in heavily doped n-type regions 127 for readout. The charge carriers are collected at the connector node 107 formed in the heavily doped n-type regions 127. Third body terminals 131 are formed in the p-doped wells 125, which is biased to a neutral reference potential.

As illustrated, heavily doped n-type regions 127 are formed over p-doped wells 125. In some embodiments, the STI region 143 is formed at the top surface of NUV photocell 120 to separate heavily doped n-type regions 127 from each other, and also to separate heavily doped n-type regions 127 from the first guard ring 129. In addition, as illustrated in FIG. 4, the p-doped wells 125 may be portioned into smaller islands.

Figure 5:
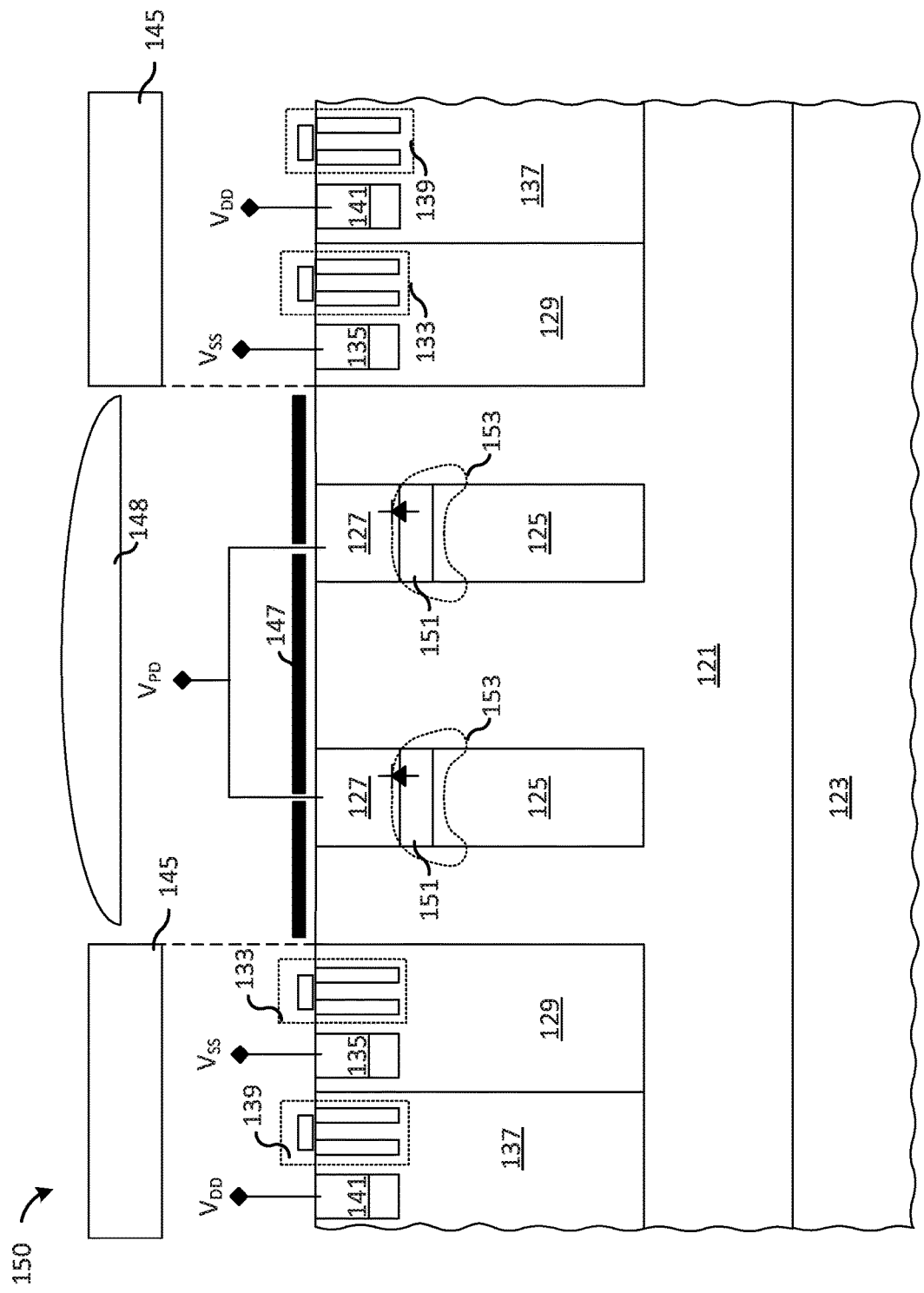
FIG. 5 is a cross-sectional view of another embodiment NUV photocell.

FIG. 5 illustrates a cross-sectional view of a NUV photocell 150 in accordance with an alternative embodiment of the present invention. In NUV photocell 150, an intrinsic semiconductor region 151 is formed between heavily doped n-type regions 127 and p-doped wells 125 creating a p-i-n junction. This is in contrast with the p-n junction formed between heavily doped n-type regions 127 and p-doped wells 125 in, for example, FIG. 3.

The intrinsic semiconductor region 151 may be intrinsic or may be doped to a very low doping, e.g., less than $10^{14}$ cm⁻³. In various embodiments, the doping concentration of the intrinsic semiconductor region 151 is much lower (i.e., $10^{11}$ cm⁻³ to $10^{12}$ cm⁻³). The thickness of the intrinsic semiconductor region 151 is between 200 nm to 300 nm. The intrinsic semiconductor region 151 may be formed by counter doping the p-doped wells 125 with an n-type implant deeper than the implant that forms the heavily doped n-type regions 127.

During operation, the intrinsic semiconductor region 151 increases the width of the depletion region 153 of the p-i-n photodiode. The increase in depletion width reduces the junction capacitance of the photodiode and improves the charge to voltage conversion rate.

Figure 6:
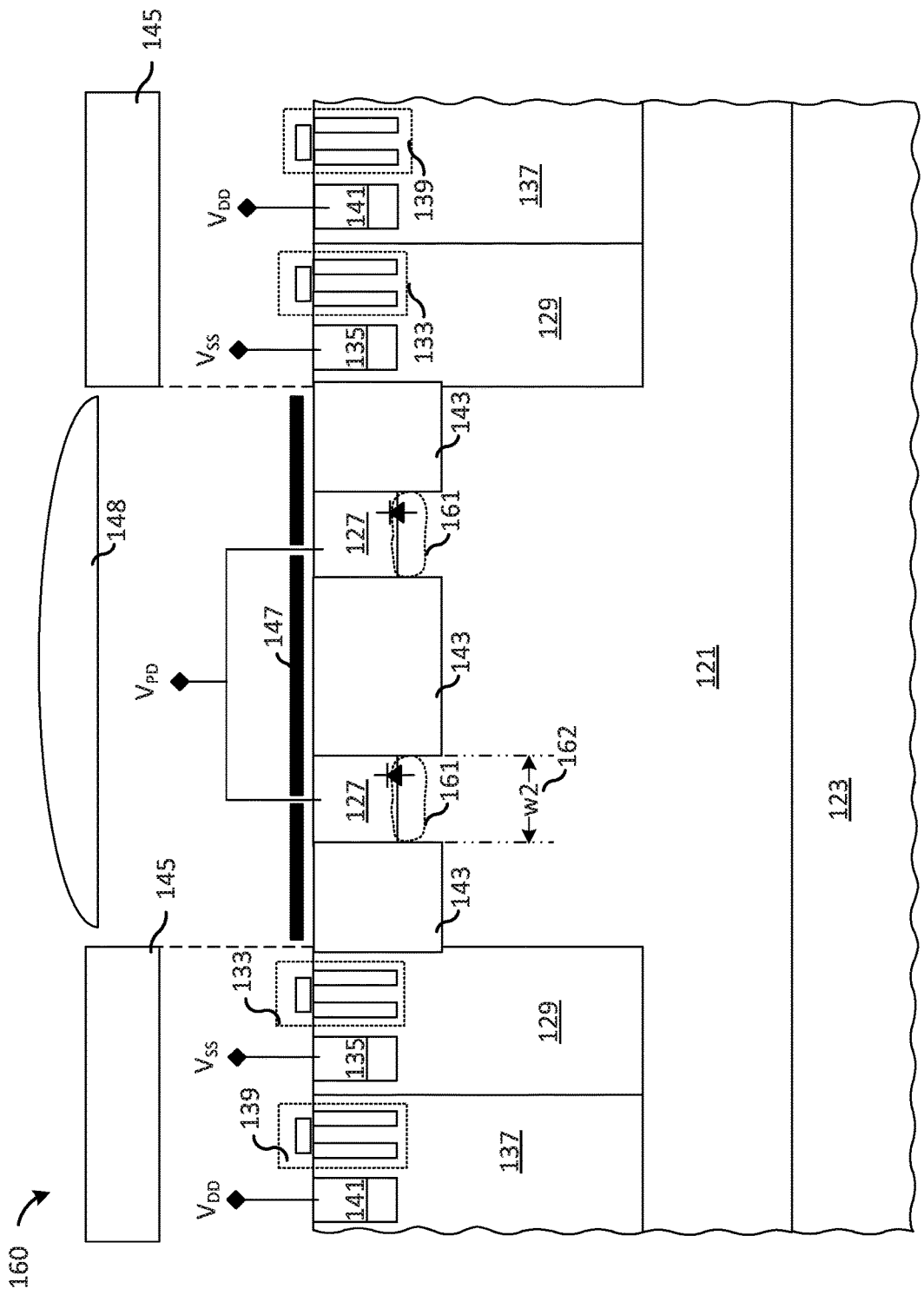
FIG. 6 is a cross-sectional view of another embodiment NUV photocell.

FIG. 6 illustrates a cross-sectional view of a NUV photocell 160 in accordance with yet another embodiment of the present invention. Unlike the prior embodiments, the p-doped wells 125 may be absent in this embodiment. Accordingly, as illustrated in FIG. 6, the p-epitaxial layer 121 fills the volume previously filled with the p-doped wells 125, for example, in FIG. 2. As a result, a p-n junction is formed at the boundary of the p-epitaxial layer 121 and the heavily doped n-type regions 127 creating the depletion region 161 around this p-n junction.

The doping of the p-epitaxial layer 121 is lower (i.e., $10^{13}$ to $10^{15}$ cm⁻³) than the doping level concentration of p-doped wells 125, which is usually $10^{15}$ to $10^{17}$ cm⁻³. The reduction in dopant concentration of the p-type semiconductor of the photodiode results in an increase of its depletion width. As a result, the depletion width of the photodiodes formed between each of the p-epitaxial layer 121 and the heavily doped n-type regions 127 in the NUV photocell 160 is slightly greater than the depletion width of the photodiodes formed from each of the p-doped wells 125 and its respective heavily doped n-type regions 127, in NUV photocell 120 of FIG. 2. The increase in depletion width results in a lower junction capacitance without compromising on the collection efficiency.

Additionally, in the NUV photocell 160, the physical boundaries of the heavily doped n-type regions 127 are laterally defined by the STI region 143. Moreover in a typical manufacturing process, the design rules applicable to a typical well region are generally coarser than that of the heavily doped n-type or the heavily doped p-type regions. This is generally due to the deeper implants specific to the well regions and as such, the well regions are more spread out in comparison to the shallower heavily doped n-type or p-type regions. As a result, the heavily doped n-type implant in the NUV photocell 160 is better controlled than those of the well regions. Such a design allows for easier scaling of the NUV photocell 160. As an example, the NUV photocell 160 described using FIG. 6 may be formed having a second width 162 (w2) of between 0.3 µm to 15 µm. In contrast, the first width 128 (w1) of the NUV photocell 120 described using FIG. 2A is between 1 µm to 15 µm.

Figure 7:
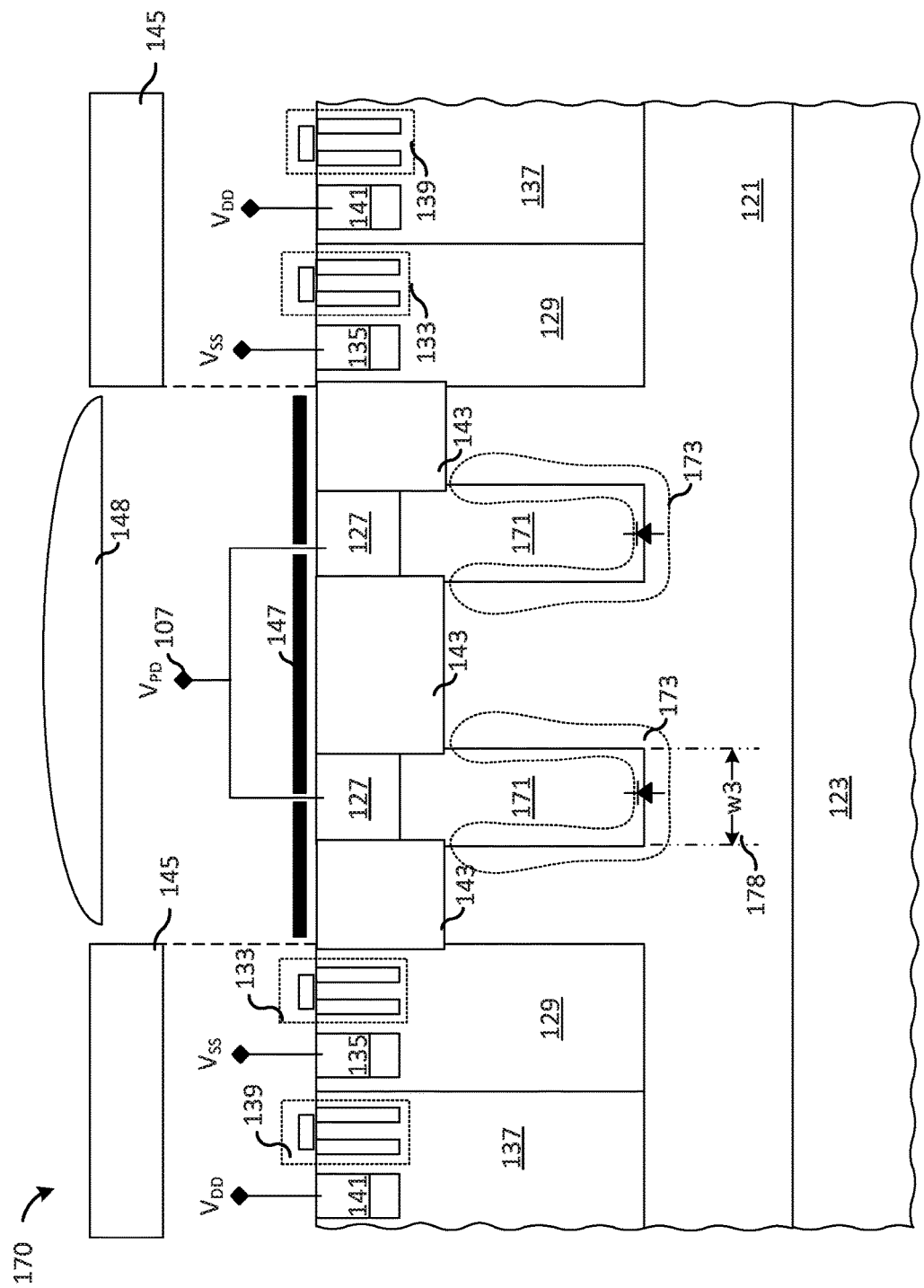
FIG. 7 is a cross-sectional view of yet another embodiment NUV photocell.
Figure 8:
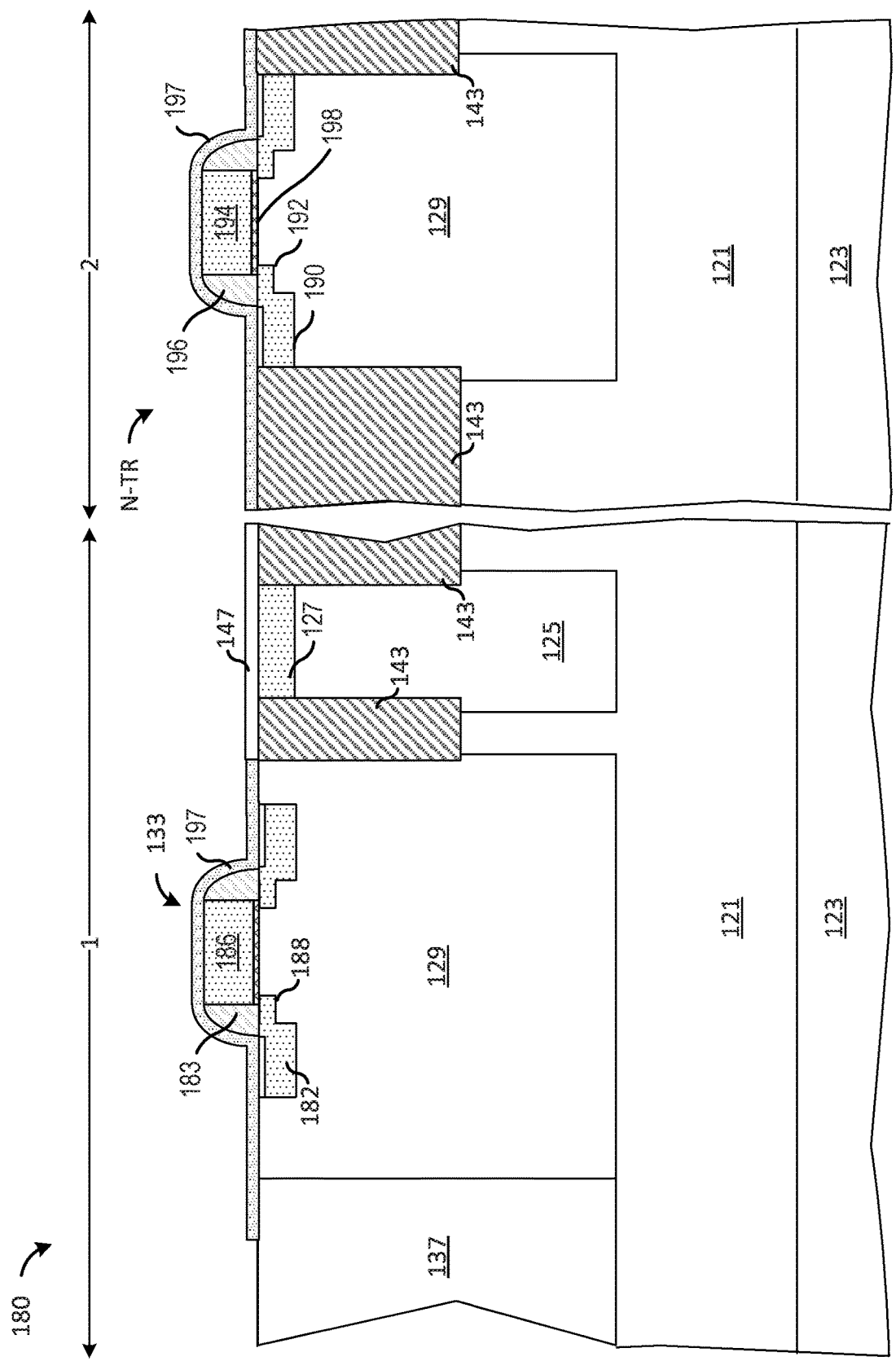
FIG. 8 is a cross-sectional view of a semiconductor device in accordance with an embodiment of the present invention.

FIG. 7 illustrates a cross-sectional view of another embodiment NUV photocell 170. In FIG. 7, n-doped wells 171 are disposed under the heavily doped n-type regions 127, but unlike FIG. 2, the photodiode is formed between the n-doped wells 171 and the p-epitaxial layer 121.

As the n-doped wells 171 have a lower doping concentration (i.e., $10^{13}$ to $10^{15}$ cm⁻³) than the heavily doped n-type regions 127 (i.e., $10^{15}$ to $10^{17}$ cm⁻³), the width of the depletion region 173 in the NUV photocell 170 is greater than the width of the depletion region 161 in the NUV photocell 160. As a result, NUV photocell 170 has a lower unit junction capacitance compared to NUV photocell 160 of FIG. 6.

The improved junction capacitance of NUV photocell 170 comes at the cost of positional accuracy of the n-type semiconductor, as previously described with FIG. 6. The degradation in positional accuracy, increases variation in individual junction capacitances of NUV photocell 170. For example, the NUV photocell 170 described using FIG. 7 may be formed having a third width 178 (w3) of between 1 µm to 15 µm.

FIG. 8 illustrates a cross-sectional view of a semiconductor device in accordance with an embodiment of the present invention.

The semiconductor chip 180 includes multiple regions, for example, may include a first portion 1 and a second portion 2. The first portion 1 comprises an NUV photocell, for example the NUV photocell 120 of FIG. 2. However, the first portion 1 may also include the NUV photocell 150, 160, or 170 of FIGS. 5, 6, and 7 respectively. As illustrated, only portions of the NUV photocells 120 are shown in FIG. 8. The second portion 2 may include functional circuitry of the semiconductor device. For example, as an illustration, the second portion 2 comprises an n-channel transistor (N-TR) formed on a semiconductor substrate 183.

In some embodiments, the processes used to form the first portion 1 and the second portion 2 are shared with a common CMOS process. Therefore the depth and the doping level of the regions that are formed with the shared CMOS process in the first portion 1 and the second portion 2 may be similar.

In various embodiments, the n-channel transistor (N-TR) are formed using a CMOS process flow. The common heavily doped P++ silicon substrate 123 may be a bulk semiconductor substrate such as a silicon substrate, a silicon on insulator substrate, a germanium substrate, a gallium nitride substrate including a gallium nitride on silicon substrate, silicon carbide substrate including a silicon carbide on silicon substrate, gallium arsenide, and others. The semiconductor substrate 183 may include epitaxial layers.

The n-channel transistor (N-TR) comprises n-type source/drain regions 190, n-type drain extension regions 192, halo regions (not shown), channel region between the n-type drain extension regions 192, first gate 194, and first spacer 196. An etch stop liner 197 is disposed over the first gate 194, and the n-type source/drain regions 190.

The NUV photocell 120 in the first portion 1 is formed in the p-epitaxial layer 121. The p-epitaxial layer 121 may be formed over the heavily doped P++ silicon substrate 123. As illustrated, in one embodiment, photodiode regions including the read circuitry of the photodiode such as the NMOS transistor (133) may be formed at the same time as the n-channel transistor (N-TR) of portion 2. The NMOS transistor 133 comprises n-type source/drain regions 182, halo regions (not shown), channel region between the n-type drain extension regions 188, second gate 186, and second spacer 183. The anti-reflection layer 147 is formed on the top surface of the NUV photocell 120 over heavily doped n-type regions 127 and STI regions 143.

The n-channel transistor (N-TR), the NMOS transistor 133, and the photodiode formed by the heavily doped n-type region 127 and the p-doped well 125 may be electrically isolated from adjacent devices by the shallow trench isolation (STI) regions 143.

Figure 9:
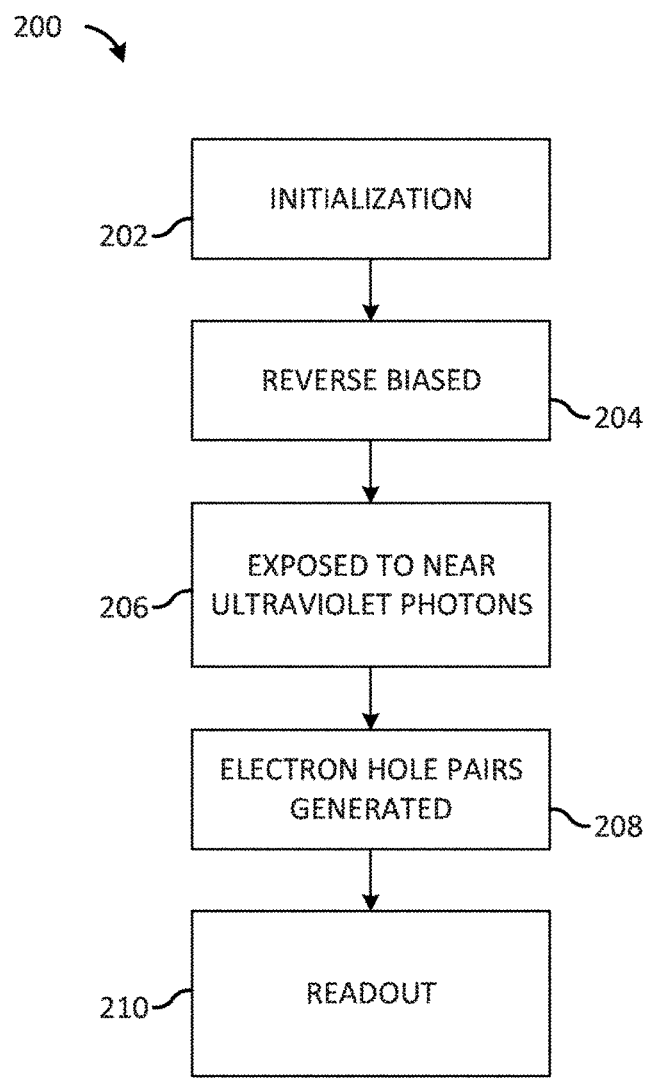
FIG. 9 is a flowchart of an embodiment NUV photocell.

FIG. 9 illustrates a flowchart 200 of an embodiment NUV photocell. Although the NUV photocell 120 of FIG. 2 is referenced, the flowchart 200 may be applied to any of the NUV photocells 120, 150, 160, and 170 of respective FIGS. 2, 5, 6, and 7.

In the flowchart 200, at step 202, the NUV photocell 120 is initialized. The initialization routine clears the charge carriers in the depletion regions 149. One or more NMOS or PMOS transistors, such as NMOS transistors 133 and PMOS transistors 139 or an initialization circuit coupled to the various body terminals, such as the third body terminals 131 and connector node 107 may be used to clear the photoactive regions of the photocell 120 of charge carriers.

Additionally, during the initialization step 202, the first guard ring 129 and the second guard ring 137 may be initialized by setting the first body terminals 135 to a neutral reference potential (e.g., $V_{SS}$=0V) and the second body terminals 141 to a positive supply voltage ($V_{DD}$), typically more positive than the potential applied across the photodiode.

At step 204, the photodiode of the NUV photocell 120 is put in reverse bias mode by applying a negative bias at the p-type silicon, for example, the p-doped wells 125 and a positive bias at the n-type silicon, for example, the heavily doped n-type regions 127.

At step 206, while the NUV photocell 120 is in reverse bias mode, NUV photons are exposed to the NUV photocell 120. At step 208, electron hole pairs are generated in the body of each of the photodiodes. These charge carriers are randomly diffused in the body of the photodiode until they reach the depletion region 149. The electron carriers diffuse to the depletion region 149 and the hole carriers diffuse to the p-doped wells 125; the p-doped wells 125 may be coupled to a neutral reference potential (e.g., $V_{SS}$=0V). At step 210, during a read operation of the NUV photocell 120, a voltage or a current is read at the connector node 107 of the NUV photocell 120. The read operation of the NUV photocell 120 typically depends on the sensor circuit used to operate the NUV photocell 120. FIGS. 10, 11, and 12 illustrate several typical sensor circuit configurations that can be used with the embodiments of this disclosure for the purposes of readout.

FIG. 10 illustrates a circuit diagram of a conventional 1 transistor (1T) active pixel sensor circuit 220. As illustrated, the circuit has two sections, first section 221 and second section 222. The first section 221 is applicable to each pixel while the section 222 applies to a readout circuit that may be shared with a column of pixels in an image sensor having an array of pixels arranged in a matrix configuration.

The first section 221 comprises a photodiode 223, the photodiode capacitor ($C_{PD}$), and a single transistor (M1). The gate node of the M1 transistor is connected to a control voltage ($V_{READ}$) and the source node is connected to the photodiode 223 and the $C_{PD}$ photodiode capacitor. The drain node of the M1 transistor is connected to section 222.

The second section 222 comprises an operational amplifier (Op-amp) 224 and a feedback capacitor ($C_{FB}$). The $C_{FB}$ feedback capacitor is coupled between the output terminal ($V_{OUT}$) and the negative input terminal ($V_X$) of the op-amp 224. The positive terminal ($V_{REF}$) of the op-amp 224 is connected to a reference potential voltage.

During the initialization step, the $V_{READ}$ control voltage is in the high state and the M1 transistor is in the ON-state. The voltages $V_{PD}$, $V_X$, and $V_{REF}$ are at the same potential and the photodiode 223 is in reverse bias mode at a voltage near $V_{REF}$.

After the initialization step, and at the beginning of the integration period, the $V_{READ}$ control voltage is switched to a low state and the M1 transistor is in the OFF-state. During the integration period, while the photodiode 223 is exposed to NUV photons, electron hole carriers are generated in the body of the photodiode 223. The electrons diffuse to the depletion region of the photodiode 223 while the holes diffuse to a neutral reference potential and are cleared from the photodiode 223. Over time, electrons accumulate at the photodiode 223 and the $C_{PD}$ photodiode capacitor and the voltage $V_{PD}$ decays.

During the read period, the $V_{READ}$ control voltage transitions back to the high state, the M1 transistor turns ON, and the voltages $V_{PD}$, $V_X$, and $V_{REF}$ are again at a same potential and the photodiode 223 is in reverse bias mode. The $V_{OUT}$ output voltage of the op-amp 224 is the sum of the ratio of charges (Q–$C_{PD}$) accumulated in the $C_{PD}$ photodiode capacitor with respect to the charges (Q–$C_{FB}$) of the $C_{FB}$ feedback capacitor and the $V_{REF}$ reference voltage or otherwise $V_{OUT}$=$V_{REF}$+(Q–$C_{PD}$/Q–$C_{FP}$), which is sampled, for example with an analog to digital converter for a digital readout. The process is repeated to capture the next readout.

FIG. 11 illustrates a circuit diagram of a conventional 3 transistor (3T) active pixel sensor circuit 230. As illustrated, the circuit has two sections, a first section 231 and a second section 232. The first section 231 is applicable to each pixel while the section 232 applies to a readout circuit that may be shared with a column of pixels in an image sensor having an array of pixels that are arranged in a matrix configuration.

The first section 231 comprises a photodiode 233, the photodiode capacitor ($C_{PD}$), and three transistors (M1, M2, and M3). The gate node of the M2 transistor is connected to a reset control voltage ($V_{RST}$) and the source node is connected to a $V_{RT}$ voltage rail. The M1 transistor is configured as a source follower transistor since the gate node of the M1 transistor is connected to the drain node of the M2 transistor. The source node of the M1 transistor is connected to a $V_{DD}$ voltage rail. The drain node ($V_{SF}$) of the M1 transistor is connected to the source node of the M3 transistor. The M3 transistor is controlled using the READ voltage control, which is connected to the gate node of the M3 transistor. The drain node of the M3 transistor is connected to the second section 232. The second section 232 comprises an analog to digital converter 234.

During the initialization step, the $V_{RST}$ control voltage is in the high state and the M2 transistor is in the ON-state. The voltage $V_{PD}$ is very near equal to that of the voltage of the $V_{RT}$ voltage rail and the photodiode 233 is in reverse bias mode.

After the initialization step, and at the beginning of the integration period, the $V_{RST}$ control voltage is switched to a low state and the M2 transistor is in the OFF-state. During the integration period, while the photodiode 233 is exposed to NUV photons, electron hole carriers are generated in the body of the photodiode 233. The electrons diffuse to the depletion region of the photodiode 233 while the holes diffuse to a neutral reference potential and are cleared. Over time, electrons accumulate in the $C_{PD}$ photodiode capacitor and the voltage $V_{PD}$ decays.

During the read period, while the M2 transistor remains in the OFF state, the READ voltage control transitions to a high state and the M3 transistor turns ON. The source follower M1 transistor is also in the ON state and the voltage at drain node of the M3 transistor is sampled by the analog to digital converter 234. The process is repeated for the next readout.

FIG. 12 illustrates a circuit diagram of a conventional transimpedance amplifier readout circuit 240. The transimpedance amplifier readout circuit 240 comprises a photodiode 243, the photodiode capacitor ($C_{PD}$), a current source ($I_{PHOTO}$), an op-amp 245, and a feedback resistor ($R_{FB}$). The output of the op-amp 245 is coupled to the negative terminal of the op-amp 245 through the $R_{FB}$ feedback resistor.

During the initialization step, the output of the op-amp 245 changes such that the photodiode 243 is in reverse bias mode at a voltage near that of the $V_{RT}$ voltage rail.

In a continuous read mode, while the photodiode 243 is exposed to NUV photons, electron hole carriers are generated in the body of the photodiode 243. The electrons diffuse to the depletion region of the photodiode 243 while the holes diffuse to a neutral reference potential and are cleared. In response to the $I_{PHOTO}$ current source, created as a result of the flow of electrons, and to cancel the flow of current at the negative terminal of the op-amp 245, the output of the op-amp 243 is changed to $V_{OUT}=V_{RT}+(I_{PHOTO} \cdot R_{FB})$ and sampled on or off-chip using for example an analog to digital converter.

The photodiodes 223, 233, and 243 in FIGS. 10, 11, and 12 may be applicable to any of the photodiodes of the previously discussed NUV photocells 120, 122, 150, 160, 170, and 180 of respective FIGS. 2A, 2B, 5, 6, 7, and 8. In some embodiments, where a NUV photocell has more than one photodiode, the photodiodes may be coupled to each other at the connector node.

Figure 13:
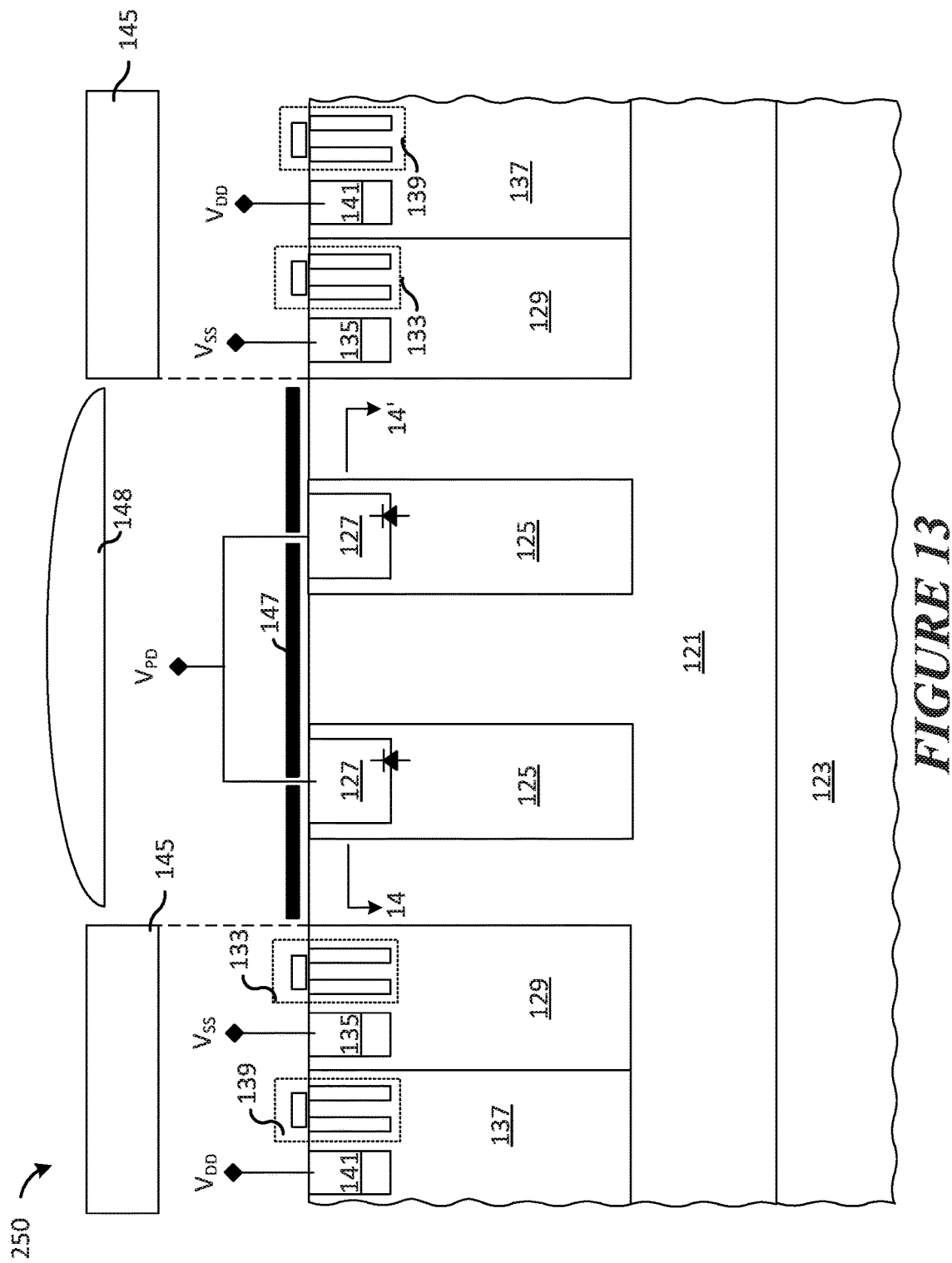
FIG. 13 is a cross-sectional view of another embodiment NUV photocell.

FIG. 13 illustrates a cross sectional view of another NUV photocell 250. In the NUV photocell 250 of FIG. 13, unlike the NUV photocell 120 of FIG. 2, the p-epitaxial layer and the p-doped wells 125 extend to the surface of the NUV photocell 122. The p-epitaxial layer is disposed between each of the heavily doped n-type regions 127 and also between the heavily doped n-type regions 127 and the first guard ring 129.

Figure 14:
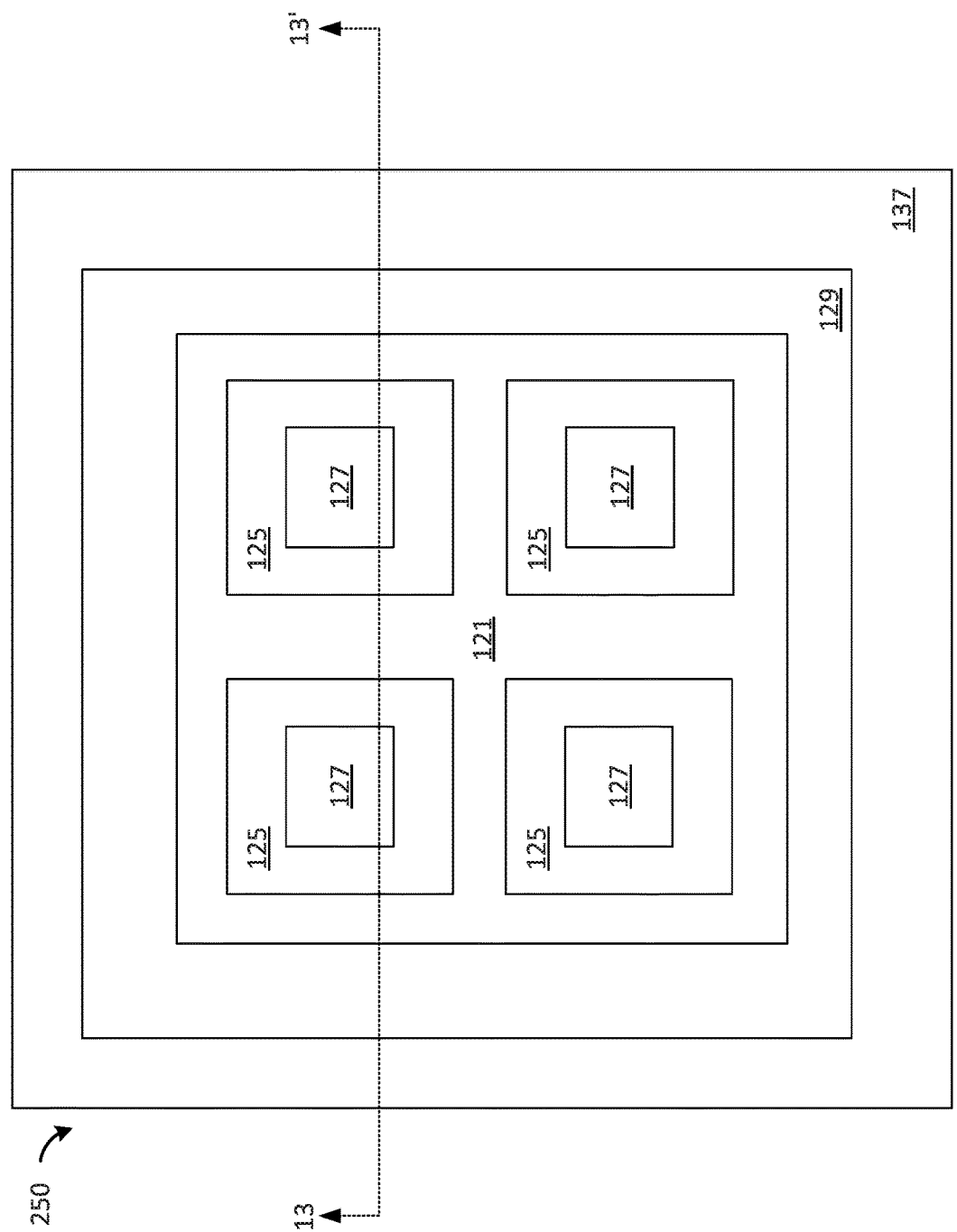
FIG. 14 is a plan view of an embodiment NUV photocell.

FIG. 14 illustrates an example top sectional view of the NUV photocell 250 previously described in FIG. 13. The line 14-14' in FIG. 13 illustrates a representative sectional view in FIG. 13 that is illustrated by FIG. 14. The line 13-13' of FIG. 14 illustrates an example location of a cross sectional cut with respect to FIG. 13 of the NUV photocell 250.

To simplify the description of FIG. 250, the PMOS transistors 139, the NMOS transistors 133, the anti-reflection layer 147, the first body terminals 135, the second body terminals 141, and the metal shield 145 are not shown. In some embodiments, to properly bias the p-doped wells 125, contact terminals may be exposed in heavily doped n-type regions 127 for readout.

As illustrated, heavily doped n-type regions 127 are formed over p-doped wells 125. In some embodiments, the p-epitaxial layer 121 is formed at the top surface of NUV photocell 250 between the heavily doped n-type regions 127, and also between the heavily doped n-type regions 127 and the first guard ring 129.

It should be clear to those skilled in the art that the various features described above with respect to the embodiments of this disclosure and with the state of the art may also be applied to embodiments that detect, accumulate, and transfer hole carriers. This can be done by inverting the conductivity type of the various elements in the embodiments and adapting the proper voltages. As an example, in FIG. 2, the p-epitaxial layer 121 is an epitaxial layer that is lightly doped with a p-type dopant; the heavily doped P$^{++}$ silicon substrate 123 is a semiconductor substrate that is heavily doped with a p-type dopant; the p-doped wells 125 and the first guard ring 129 are well regions that are lightly doped with a p-type dopant; and the heavily doped n-type regions 127 are semiconductor regions that are heavily doped with an n-type dopant. In an alternative embodiment, by inverting the dopant types of FIG. 2, an n-type to a p-type dopant and vice versa, this alternative embodiment may detect, accumulate, and transfer hole carriers in contrast with electron carriers of FIG. 2.

Example embodiments of the present invention are summarized here. Other embodiments can also be understood from the entirety of the specification and the claims filed herein.

Example 1

An image sensor includes a semiconductor substrate, an epitaxial layer disposed over the semiconductor substrate, a first heavily doped region disposed in the epitaxial layer, and a shallow trench isolation region disposed in the epitaxial layer and surrounding the first heavily doped region. The semiconductor substrate and the epitaxial layer are of a first doping type and the semiconductor substrate is coupled to a reference potential node. The first heavily doped region is of a second doping type opposite to the first doping type. The epitaxial layer, the first heavily doped region, and the shallow trench isolation region are part of a p-n junction photodiode configured to operate in the near ultraviolet region.

Example 2

The image sensor of example 1, where the first heavily doped region and the epitaxial layer form a p-n junction of the p-n junction photodiode.

Example 3

The image sensor of example 2, where the first heavily doped region has a width within a range of about 0.3 µm to 15 µm.

Example 4

The image sensor of example 1, where the image sensor further includes a first guard region of the first doping type disposed in the epitaxial layer. The first guard region surrounding the p-n junction photodiode.

Example 5

The image sensor of example 4, where the image sensor further includes a second guard region of the second doping type disposed in the epitaxial layer. The second guard region surrounding the first guard region.

Example 6

The image sensor of example 5, where the first guard region is laterally spaced about 1 µm to 25 µm from the first heavily doped region.

Example 7

The image sensor of example 1, where the image sensor further includes a second heavily doped region of the second doping type disposed in the epitaxial layer. The second heavily doped region is laterally spaced about 10 µm to 50 µm from the first heavily doped region.

Example 8

The image sensor of example 1, where the image sensor further includes a well region of the first doping type disposed in the epitaxial layer. The first heavily doped region and the well region form a p-n junction of the p-n junction photodiode.

Example 9

The image sensor of example 8, where the image sensor further includes an intrinsic semiconductor region of the first doping type disposed in the epitaxial layer. The first heavily doped region, the intrinsic semiconductor region, and the well region form a p-i-n junction of a p-i-n junction photodiode.

Example 10

The image sensor of example 1, the image sensor further includes a well region of the second doping type disposed in the epitaxial layer. The well region and the epitaxial layer form a p-n junction of the p-n junction photodiode.

Example 11

The image sensor of example 1, the image sensor further includes an intrinsic semiconductor region of the first doping type disposed in the epitaxial layer. The first heavily doped region, the intrinsic semiconductor region, and the epitaxial layer form a p-i-n junction of a p-i-n junction photodiode.

Example 12

The image sensor of example 1, where the first heavily doped region has a first major surface facing the epitaxial layer and a second major surface facing away from the epitaxial layer. The image sensor further includes a microlens disposed over the second major surface of the first heavily doped region.

Example 13

The image sensor of example 1, where the image sensor is configured to capture photons in a wavelength between 300 nm to 450 nm and convert into a charge configured to be collected at the first heavily doped region.

Example 14

An image sensor includes a semiconductor substrate coupled to a reference potential node, an epitaxial layer disposed over the semiconductor substrate, and a first heavily doped region disposed in the epitaxial layer. The semiconductor substrate and the epitaxial layer are of a first doping type. The first heavily doped region being of a second doping type opposite to the first doping type. The epitaxial layer and the first heavily doped region are part of a p-n junction photodiode configured to operate in the near ultraviolet region.

Example 15

The image sensor of example 14, where the first heavily doped region and the epitaxial layer form a p-n junction of the p-n junction photodiode.

Example 16

The image sensor of example 15, where the first heavily doped region has a width within a range of about 0.3 µm to 15 µm.

Example 17

The image sensor of example 14, where the image sensor further includes a first guard region of the first doping type disposed in the epitaxial layer. The first guard region surrounding the p-n junction photodiode. The image sensor further includes a second guard region of the second doping type disposed in the epitaxial layer. The second guard region surrounding the first guard region.

Example 18

The image sensor of example 17, where the first guard region is laterally spaced about 1 µm to 25 µm from the first heavily doped region.

Example 19

The image sensor of example 14, where the image sensor further includes a second heavily doped region of the second doping type disposed in the epitaxial layer. The second heavily doped region laterally spaced about 10 µm to 50 µm from the first heavily doped region.

Example 20

The image sensor of example 14, where the image sensor further include a well region of the first doping type disposed in the epitaxial layer. The first heavily doped region and the well region form a p-n junction of the p-n junction photodiode.

Example 21

The image sensor of example 20, where the image sensor further includes an intrinsic semiconductor region of the first doping type disposed in the epitaxial layer. The first heavily doped region, the intrinsic semiconductor region, and the well region form a p-i-n junction of a p-i-n junction photodiode.

Example 22

The image sensor of example 14, where the image sensor further includes a well region of the second doping type disposed in the epitaxial layer. The well region and the epitaxial layer form a p-n junction of the p-n junction photodiode.

Example 23

The image sensor of example 14, where the image sensor further includes an intrinsic semiconductor region of the first doping type disposed in the epitaxial layer. The first heavily doped region, the intrinsic semiconductor region, and the epitaxial layer form a p-i-n junction of a p-i-n junction photodiode.

Example 24

The image sensor of example 14, where the first heavily doped region has a first major surface facing the epitaxial layer and a second major surface facing away from the epitaxial layer. The image sensor further includes a microlens disposed over the second major surface of the first heavily doped region.

Example 25

The image sensor of example 14, where the image sensor is configured to capture photons in a wavelength between 300 nm to 450 nm and convert into a charge configured to be collected at the first heavily doped region.

Example 26

A method of operating an image sensor includes providing a photodiode that includes an epitaxial layer disposed over a semiconductor substrate, a first heavily doped region disposed in the epitaxial layer, a shallow trench isolation region disposed in the epitaxial layer and surrounding the first heavily doped region. The epitaxial layer is of a first doping type and the first heavily doped region is of a second doping type opposite to the first doping type. The method further includes applying bias to set the photodiode under reverse bias, exposing the photodiode to a photon having a wavelength in the near ultraviolet range, generating an electron-hole pair in the photodiode, transferring an electron or a hole of the electron-hole pair to a connector node, and converting the charge of the electron or the hole collected at the connector node to a read voltage.

Example 27

The method of example 26, where the method further includes applying a reference voltage to a first guard ring surrounding the photodiode. The first guard ring having the first doping type.

Example 28

The method of example 26, where the method further includes applying a supply voltage to a second guard ring surrounding the first guard ring, the second guard ring having the second doping type.

Example 29

The method of example 26, where the first heavily doped region has a width within a range of about 0.3 µm to 15 µm.

Example 30

The method of example 26, where the photodiode further includes a second heavily doped region of the second doping type disposed in the epitaxial layer. The second heavily doped region is laterally spaced about 10 µm to 50 µm from the first heavily doped region.

Example 31

The method of example 26, where the photodiode further includes a well region of the first doping type disposed in the epitaxial layer. The first heavily doped region and the well region form a p-n junction of the photodiode.

Example 32

The method of example 31, where the photodiode further includes an intrinsic semiconductor region of the first doping type disposed in the epitaxial layer. The first heavily doped region, the intrinsic semiconductor region, and the well region form a p-i-n junction of a p-i-n junction photodiode.

Example 33

The method of example 26, where the photodiode further includes a well region of the second doping type disposed in the epitaxial layer. The well region and the epitaxial layer form a p-n junction of the photodiode.

Example 34

The method of example 26, where the photodiode further includes an intrinsic semiconductor region of the first doping type disposed in the epitaxial layer. The first heavily doped region, the intrinsic semiconductor region, and the epitaxial layer form a p-i-n junction of a p-i-n junction photodiode.

Example 35

The method of example 26, where the image sensor is configured to capture photons in a wavelength between 300 nm to 450 nm and convert into a charge configured to be collected at the first heavily doped region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. Moreover, it is understood that the present invention is not limited to the example dimensions as disclosed. In fact, it is expected that these dimensions will be smaller over time. Although, the features of the present disclosure may be described with respect to certain figures and embodiments, all embodiments of the present disclosure may also include one or more of the advantageous features discussed herein. Specifically, while one or more of the embodiments may be described as having a particular advantageous feature, one or more of these features can additionally be used in accordance with the different embodiments of the disclosure.

What is claimed is:

1. An image sensor comprising:
a semiconductor substrate of a first doping type, the semiconductor substrate coupled to a reference potential node;
an epitaxial layer disposed over the semiconductor substrate;
a first heavily doped region of a second doping type disposed in the epitaxial layer, the second doping type being opposite to the first doping type;
a first guard region disposed in the epitaxial layer, the first guard region and the epitaxial layer having the first doping type; and
a shallow trench isolation region disposed in the epitaxial layer, in contact with the first guard region, and surrounding the first heavily doped region, wherein the epitaxial layer, the first heavily doped region, and the shallow trench isolation region are part of a p-n junction photodiode surrounded by the first guard region, and wherein the p-n junction photodiode is configured to operate in the near ultraviolet region.

2. The image sensor of claim 1, wherein the first heavily doped region and the epitaxial layer form a p-n junction of the p-n junction photodiode.

3. The image sensor of claim 2, wherein the first heavily doped region has a width within a range of about 0.3 μm to 15 μm.

4. The image sensor of claim 1, further comprising a second guard region of the second doping type disposed in the epitaxial layer, the second guard region surrounding the first guard region.

5. The image sensor of claim 4, wherein the first guard region is laterally spaced about 1 μm to 25 μm from the first heavily doped region.

6. The image sensor of claim 1, further comprising a second heavily doped region of the second doping type disposed in the epitaxial layer, the second heavily doped region laterally spaced about 10 μm to 50 μm from the first heavily doped region.

7. The image sensor of claim 1, further comprising a well region of the first doping type disposed in the epitaxial layer, wherein the first heavily doped region and the well region form a p-n junction of the p-n junction photodiode.

8. The image sensor of claim 7, further comprising an intrinsic semiconductor region of the first doping type disposed in the epitaxial layer, wherein the first heavily doped region, the intrinsic semiconductor region, and the well region form a p-i-n junction of a p-i-n junction photodiode.

9. The image sensor of claim 7, further comprising an intrinsic semiconductor region of the first doping type disposed in the epitaxial layer, wherein the first heavily doped region, the intrinsic semiconductor region, and the well region form a p-i-n junction of a p-i-n junction photodiode.

10. The image sensor of claim 1, further comprising a well region of the second doping type disposed in the epitaxial layer, wherein the well region and the epitaxial layer form a p-n junction of the p-n junction photodiode.

11. The image sensor of claim 1, further comprising an intrinsic semiconductor region of the first doping type disposed in the epitaxial layer, wherein the first heavily doped region, the intrinsic semiconductor region, and the epitaxial layer form a p-i-n junction of a p-i-n junction photodiode.

12. The image sensor of claim 1, wherein the first heavily doped region has a first major surface facing the epitaxial layer and a second major surface facing away from the epitaxial layer, the image sensor further comprising a microlens disposed over the second major surface of the first heavily doped region.

13. The image sensor of claim 1, wherein the image sensor is configured to capture photons in a wavelength between 300 nm to 450 nm and convert into a charge configured to be collected at the first heavily doped region.

14. The image sensor of claim 1, wherein the first heavily doped region has a depth of 0.5 μm.

15. An image sensor comprising:
a semiconductor substrate of a first doping type, the semiconductor substrate coupled to a reference potential node;
an epitaxial layer of the first doping type disposed over the semiconductor substrate;
a first heavily doped region of a second doping type disposed in the epitaxial layer, the second doping type being opposite to the first doping type, wherein the epitaxial layer and the first heavily doped region are part of a p-n junction photodiode, and wherein the p-n junction photodiode is configured to operate in the near ultraviolet region; and
a well region of the first doping type disposed in the epitaxial layer, wherein the first heavily doped region and the well region form a p-n junction of the p-n junction photodiode.

16. The image sensor of claim 15, wherein the first heavily doped region and the epitaxial layer form a p-n junction of the p-n junction photodiode.

17. The image sensor of claim 16, wherein the first heavily doped region has a width within a range of about 0.3 μm to 15 μm.

18. The image sensor of claim 15, further comprising:
a first guard region of the first doping type disposed in the epitaxial layer, the first guard region surrounding the p-n junction photodiode; and
a second guard region of the second doping type disposed in the epitaxial layer, the second guard region surrounding the first guard region.

19. The image sensor of claim 18, wherein the first guard region is laterally spaced about 1 μm to 25 μm from the first heavily doped region.

20. The image sensor of claim 15, further comprising a second heavily doped region of the second doping type disposed in the epitaxial layer, the second heavily doped region laterally spaced about 10 μm to 50 μm from the first heavily doped region.

21. The image sensor of claim 15, further comprising a well region of the second doping type disposed in the epitaxial layer, wherein the well region and the epitaxial layer form a p-n junction of the p-n junction photodiode.

22. The image sensor of claim 15, further comprising an intrinsic semiconductor region of the first doping type disposed in the epitaxial layer, wherein the first heavily doped region, the intrinsic semiconductor region, and the epitaxial layer form a p-i-n junction of a p-i-n junction photodiode.

23. The image sensor of claim 15, wherein the first heavily doped region has a first major surface facing the epitaxial layer and a second major surface facing away from the epitaxial layer, the image sensor further comprising a micro-lens disposed over the second major surface of the first heavily doped region.

24. The image sensor of claim 15, wherein the image sensor is configured to capture photons in a wavelength between 300 nm to 450 nm and convert into a charge configured to be collected at the first heavily doped region.

25. The image sensor of claim 15, wherein the well region has a depth of 1 μm to 2 μm.

26. A method of operating an image sensor, the method comprising:
  providing a photodiode comprising:
    an epitaxial layer of a first doping type disposed over a semiconductor substrate;
    a first heavily doped region of a second doping type disposed in the epitaxial layer, the second doping type being opposite to the first doping type;
    a guard region of the first doping type disposed in the epitaxial layer, the guard region laterally spaced from the first heavily doped region; and
    a shallow trench isolation region disposed in the epitaxial layer and surrounding the first heavily doped region;
  applying bias to set the photodiode under reverse bias;
  exposing the photodiode to a photon having a wavelength in the near ultraviolet range;
  generating an electron-hole pair in the photodiode;
  transferring an electron or a hole of the electron-hole pair to a connector node; and
  converting the charge of the electron or the hole collected at the connector node to a read voltage.

27. The method of claim 26, further comprising applying a reference voltage to a first guard ring surrounding the photodiode, the first guard ring having the first doping type.

28. The method of claim 27, further comprising applying a supply voltage to a second guard ring surrounding the first guard ring, the second guard ring having the second doping type.

29. The method of claim 26, wherein the first heavily doped region has a width within a range of about 0.3 μm to 15 μm.

30. The method of claim 26, wherein the photodiode further comprises a second heavily doped region of the second doping type disposed in the epitaxial layer, the second heavily doped region laterally spaced about 10 μm to 50 μm from the first heavily doped region.

31. The method of claim 26, wherein the photodiode further comprises a well region of the first doping type disposed in the epitaxial layer, wherein the first heavily doped region and the well region form a p-n junction of the photodiode.

32. The method of claim 31, wherein the photodiode further comprises an intrinsic semiconductor region of the first doping type disposed in the epitaxial layer, wherein the first heavily doped region, the intrinsic semiconductor region, and the well region form a p-i-n junction of a p-i-n junction photodiode, wherein the well region has a depth of 1 μm to 2 μm.

33. The method of claim 26, wherein the photodiode further comprises a well region of the second doping type disposed in the epitaxial layer, wherein the well region and the epitaxial layer form a p-n junction of the photodiode.

34. The method of claim 26, wherein the photodiode further comprises an intrinsic semiconductor region of the first doping type disposed in the epitaxial layer, wherein the first heavily doped region, the intrinsic semiconductor region, and the epitaxial layer form a p-i-n junction of a p-i-n junction photodiode.

35. The method of claim 26, wherein the image sensor is configured to capture photons in a wavelength between 300 nm to 450 nm and convert into a charge configured to be collected at the first heavily doped region.

* * * * *